(12) United States Patent
Yu et al.

(10) Patent No.: US 9,530,759 B2
(45) Date of Patent: Dec. 27, 2016

(54) 3D PACKAGE WITH THROUGH SUBSTRATE VIAS

(71) Applicant: Taiwan Semiconductor Manufacturing Company, Ltd., Hsin-Chu (TW)

(72) Inventors: Chen-Hua Yu, Hsin-Chu (TW); Mirng-Ji Lii, Sinpu Township (TW); Hung-Yi Kuo, Taipei (TW); Hao-Yi Tsai, Hsin-Chu (TW); Chao-Wen Shih, Zhubei (TW); Tsung-Yuan Yu, Taipei (TW); Min-Chien Hsiao, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/090,475

(22) Filed: Apr. 4, 2016

(65) Prior Publication Data
US 2016/0218090 A1    Jul. 28, 2016

Related U.S. Application Data

(63) Continuation of application No. 14/528,765, filed on Oct. 30, 2014, now Pat. No. 9,305,877.

(51) Int. Cl.
*H01L 23/48* (2006.01)
*H01L 23/52* (2006.01)
(Continued)

(52) U.S. Cl.
CPC ........... *H01L 25/0657* (2013.01); *H01L 21/56* (2013.01); *H01L 21/76831* (2013.01); *H01L 21/76898* (2013.01); *H01L 21/823475* (2013.01); *H01L 23/3107* (2013.01); *H01L 23/3114* (2013.01); *H01L 23/481* (2013.01); *H01L 23/49827* (2013.01); *H01L 23/522* (2013.01); *H01L 23/528* (2013.01); *H01L 23/5226* (2013.01); *H01L 24/17* (2013.01); *H01L 24/48* (2013.01); *H01L 25/065* (2013.01); *H01L 21/561* (2013.01); *H01L 23/49816* (2013.01); *H01L 23/49822* (2013.01); *H01L 23/525* (2013.01);
(Continued)

(58) Field of Classification Search
CPC .. H01L 21/486; H01L 21/4853; H01L 23/481; H01L 23/5226; H01L 23/528; H01L 25/0657
USPC .................. 257/774; 438/687, 107
See application file for complete search history.

(56) References Cited

U.S. PATENT DOCUMENTS

| | | |
|---|---|---|
| 2014/0217610 A1 | 8/2014 | Jeng et al. |
| 2015/0200182 A1 | 7/2015 | Wang et al. |

(Continued)

*Primary Examiner* — David S Blum
(74) *Attorney, Agent, or Firm* — Slater Matsil, LLP

(57) ABSTRACT

A package, comprising a substrate having electrical devices disposed at a first side of the substrate, vias extending from the first side of the substrate to a second side of the substrate opposite the first side and metallization layers disposed on the first side of the substrate. Contact pads are disposed over the first metallization layers and a protection layer is disposed over the contact pads. Post-passivation interconnects are disposed over the protection layer and extend to the contact pads through openings in the protection layer. Connectors are disposed on the PPIs and a molding compound extends over the PPIs and around the connectors.

20 Claims, 11 Drawing Sheets

(51) Int. Cl.
*H01L 29/40* (2006.01)
*H01L 21/44* (2006.01)
*H01L 21/48* (2006.01)
*H01L 21/50* (2006.01)
*H01L 25/065* (2006.01)
*H01L 23/522* (2006.01)
*H01L 23/31* (2006.01)
*H01L 21/768* (2006.01)
*H01L 21/8234* (2006.01)
*H01L 23/528* (2006.01)
*H01L 23/00* (2006.01)
*H01L 23/498* (2006.01)
*H01L 23/525* (2006.01)
*H01L 21/56* (2006.01)

(52) U.S. Cl.
CPC ............ *H01L 2224/0231* (2013.01); *H01L 2224/12105* (2013.01); *H01L 2224/13024* (2013.01); *H01L 2224/14181* (2013.01); *H01L 2224/16055* (2013.01); *H01L 2224/16057* (2013.01); *H01L 2224/16145* (2013.01); *H01L 2224/16155* (2013.01); *H01L 2224/48145* (2013.01); *H01L 2224/48227* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2924/14* (2013.01)

(56) References Cited

U.S. PATENT DOCUMENTS

2015/0214110 A1 7/2015 Lin et al.
2016/0218089 A1* 7/2016 Lee .................... H01L 25/0657

\* cited by examiner

3D PACKAGE WITH THROUGH SUBSTRATE VIAS

PRIORITY CLAIM

This application claims the benefit to and is a continuation of U.S. patent application Ser. No. 14/528,765, now U.S. Pat. No. 9,305,877, filed on Oct. 30, 2014, and entitled "3D PACKAGE WITH THROUGH SUBSTRATE VIAS" which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Dies, wafers or packages may be installed on top of one another to further reduce the form factor of the semiconductor device. A die may be formed with connectors on the top and bottom surface, permitting multiple dies to be stacked to form a 3D integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
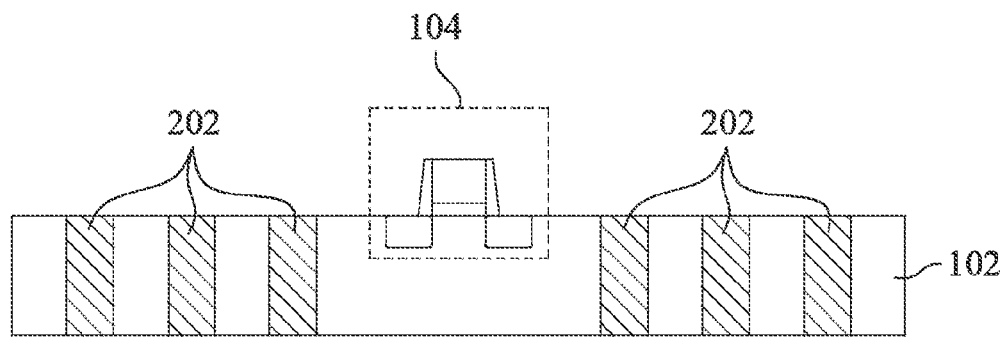
FIGS. 1-14 illustrate cross-sectional views of intermediate process steps in forming a structure according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, semiconductor devices are bonded together to form packages with various capabilities. In some processes, electrical connections are formed through a semiconductor substrate by, for example, through substrate vias. The vias provide electrical connectivity for elements on the substrate to external devices by way of conductive elements on the top and bottom of the substrate. The conductive elements have connectors such as solder balls, conductive bumps, pillars, studs, or the like that that permit vertical stacking of multiple dies or packages.

In some embodiments of the structure disclosed herein, a redistribution layer structure (RDL) formed over a substrate has post-passivation interconnects with connectors disposed thereon. It has been discovered that a connector formed on a PPI layer having a liquid molding compound (LMC) formed around the connector provides increased reliability for the connectors and lower production cost than other structures. The LMC provides support for the connectors while permitting the maximum contact area between the connector and the PPI.

FIG. 1 illustrates a cross-sectional view of a substrate 102 with an electrical device 104 formed thereon according to some embodiments. In some embodiments, the substrate 102 is a semiconductor such as silicon (Si), gallium arsenide (GaAs) or the like. One or more electrical devices 104 such as transistors, resistors, capacitors, inductors, diodes or the like are formed on the substrate 102. For example, in embodiments where the substrate 102 is a semiconductor such as silicon, electrical devices 104 such as transistors are formed on the substrate 102. In other embodiments, the substrate is an interposer, insulator, PCB, or the like. In such embodiments, the electrical devices are dies, discrete devices, packages, or the like. It should be understood that while a single electrical device 104 is illustrated herein for clarity, the embodiments are not limited to such as structure, as any number of electrical devices 104 comprising any mix of device types can be formed on the substrate 102. In some embodiments, the substrate 102 is mounted to a carrier, handling wafer, or the like during processing.

Additionally, vias 202 are formed in the substrate 102 according to some embodiments. One or more openings are formed partially through, or completely through the substrate 102. In some embodiments, the openings are formed in the substrate 102 by, for example, masking the substrate with a patterned photoresist to define the openings, and then etching the substrate using for example, a wet etch, a plasma etch, chemical or ion milling, or the like. For example, in some embodiments, a silicon substrate 102 is wet etched with an etchant such as nitric acid ($HNO_3$) and hydrofluoric acid (HF), potassium hydroxide (KOH), tetramethylammonium hydroxide (TMAH) or the like. In other embodiments, the silicon substrate 102 is plasma etched with a fluorine- or chlorine-based etchant such as carbon tetrafluoride ($CF_4$), sulfur hexafluoride ($SF_6$), chlorine ($Cl_2$), dichlorodifluoromethane ($CCL_2F_2$) or the like in a plasma field. The openings in the substrate 102 are etched anisotropically, with the sidewall of the openings substantially vertical after the etching, permitting a smaller pitch for the vias 202, resulting in more vias 202 in a given area. In some embodiments, the openings in the substrate 102 are etched completely through the substrate 102 to the carrier, if used. In other embodiments, the openings in the substrate 102 are etched partway through the substrate 102. In such embodiments, the vias 202 are formed in the openings and the backside of the substrate is reduced by, for example, grinding or etching to expose the ends of the vias 202.

An insulating liner layer (not shown for clarity) is formed in the openings on the sidewalls of the openings in the substrate 102, and a conductive material is deposited to fill the remainder of the openings. The liner layer electrically insulates the conductive material of the vias 202 from the substrate, preventing the vias 202 from interfering with operation of the electrical devices 104, and also preventing operation of the electrical devices 104 from inducing noise in the vias 202. The liner layer is an electrically insulating material such as silicon oxide (SiO), silicon nitride (SiN), silicon carbide (SiC), silicon oxynitride (SiON), or the like. The liner layer is formed by, for example, thermal oxidation, deposition by chemical vapor deposition (CVD), or the like. The liner layer is deposited as a conformal layer, with substantially uniform thickness on the sidewalls of the openings in the substrate 102. The liner layer is, in some embodiments, directionally etched after deposition to remove the liner layer on horizontal surfaces. Thus, the etch removes material of the liner from the horizontal surfaces in the openings, leaving insulating liner layers on the sidewall surfaces of the openings. For example, where the openings in the substrate 102 extend through the substrate to a carrier or other supporting surface, the liner layer is etched off of the horizontal surfaces at the bottom of the opening, permitting subsequently formed conductive material to extend through the length of the openings. In such an embodiment, the liner layer is etched, using for example, a dry plasma etch with chlorine, sulfur hexafluoride, carbon tetrafluoride, chlorine or another etchant in an argon (Ar), helium (He) or other environment. In some embodiments, the etchant is provided with, for example, oxygen ($O_2$), nitrogen ($N_2$) or other process gasses to increase the selectivity of the etch.

In some embodiments, a barrier layer (not shown for clarity) is formed in the openings, with the barrier layer formed from, for example, cobalt (Co), tantalum, tungsten, tantalum nitride (TaN), titanium nitride (TiN), or the like by CVD, plasma enhanced CVD (PECVD) or another deposition process. The barrier layer prevents diffusion of via 202 material into the substrate 102. The vias 202 are formed by forming a conductive material on the liner layer in the openings. The vias 202 are created by filling the openings with a conductive material such as copper (Cu) aluminum (Al), aluminum copper alloy (AlCu), gold, titanium, cobalt, an alloy, or another conductive material. In some embodiments, the vias 202 are formed through, for example, electrochemical plating (ECP), electroplating, electroless plating or another process. In such embodiments, a seed layer (not shown) is formed on the surfaces of the openings in the substrate 102 by, for example, atomic layer deposition, with the remainder of the via material deposited on the seed layer. The seed layer provides nucleation sites for the plating process and increases the uniformity of the plated material that forms the vias 202.

In some embodiments, the vias 202 are formed before the electrical devices 104. In such embodiments, the vias 202 are formed and the top surfaces of the vias 202 are planarized with the top surface of the substrate 102 by, for example, CMP, polishing, etching or another reduction process and the electrical devices 104 are formed or mounted on the substrate after formation of the vias 202. However, in other embodiments, the electrical devices 104 are formed before the vias 202.

Figure 2:
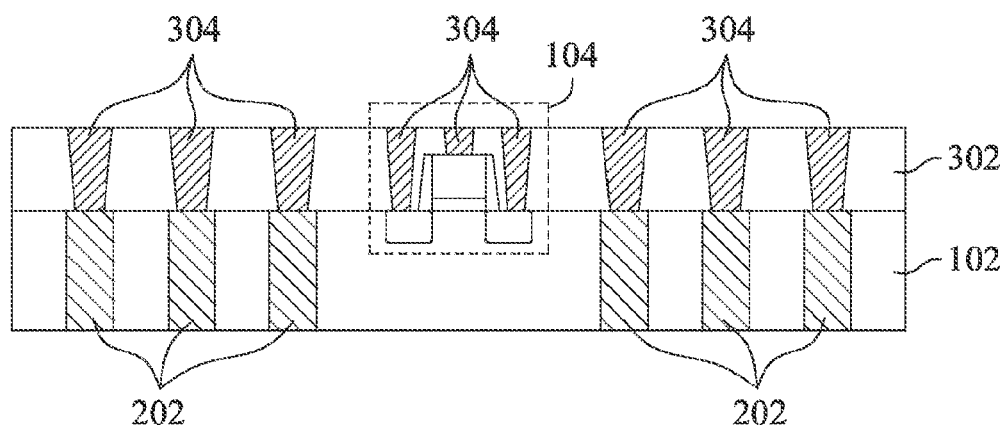

FIG. 2 is a cross-sectional view illustrating formation of an interlayer dielectric (ILD) 302 with contact plugs 304 according to some embodiments. The ILD 302 is a dielectric material such as silicon oxide, silicon nitride, silicon oxynitride, or another high-k dielectric material that is deposited by CVD or another deposition process. The ILD 302 is formed over the electrical devices 104, and in some embodiments, extends above the topmost surfaces of the electrical devices 104 to provide a planar surface for subsequently formed layers.

The ILD 302 has one or more contact plugs 304 extending from the top surface of the ILD 302 to the vias 202 and the electrical devices 104. In some embodiments, openings for the contact plugs 304 are formed in the ILD 302 by masking and etching the ILD, by laser drilling, or another technique. Additionally, in some embodiments, the contact plugs 304 have a barrier layer and are formed, for example, as described above with respect to the vias 202.

Figure 3:
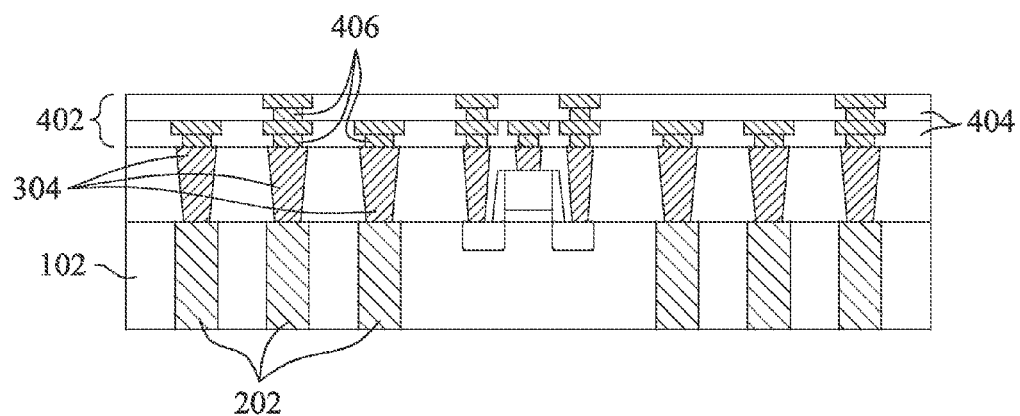

FIG. 3 is a cross-sectional view illustrating formation of the top metallization layers 402 according to some embodiments. The metallization layers 402 are disposed over the ILD 302 and have one or more intermetal dielectrics (IMD) layers 404. The metallization layers 402 also have conductive elements 406 disposed in the IMDs 404. The conductive elements 406 in the metallization layers 402 provide electrical connectivity between the vias 202, the electrical devices 104, and subsequently formed features. While multiple metallization layers, with multiple IMD layers and multiple layers of conductive elements 406 are illustrated, the embodiments are not limited to such an arrangement, as in some embodiments, the metallization layers 402 have one or more IMD 404.

In some embodiments, the conductive elements 406 are formed by metal layer deposition and patterning, for example, by deposition of a seed layer, masking and deposition of metal over the patterned mask. The mask and exposed portions of the seed layer are removed, and a dielectric layer such as an oxide, nitride, oxynitride, polybenzoxazole (PBO) or the like is formed around the patterned metal elements. The process is repeated to form additional layers, with the metal features in each layer aligning with metal elements in adjacent metal features to form conductive elements 112.

In other embodiments, a damascene or dual damascene process is used to form the metallization layers 402. In such processes, a dielectric layer is deposited and etched to form the IMD 404. The etching forms openings for lateral lines and vias between adjacent layers. A metal layer is deposited over the patterned IMD 404 and subsequently planarized to remove any excess metal, leaving conductive elements 406 in the IMD 404. In a single damascene process, each dielectric layer is etched to form either via or lateral line openings, and the conductive elements 406 are formed in the openings. The process is repeated to form subsequent layers of lateral lines and vias. In a dual damascene process, a dielectric layer is etched with both the lateral line and via openings by patterning and etching the lateral line openings, and then etching the via openings in the bottom of the lateral line openings. A metal layer is deposited over the via and lateral line openings and then planarized to form the conductive elements 406.

Figure 4:
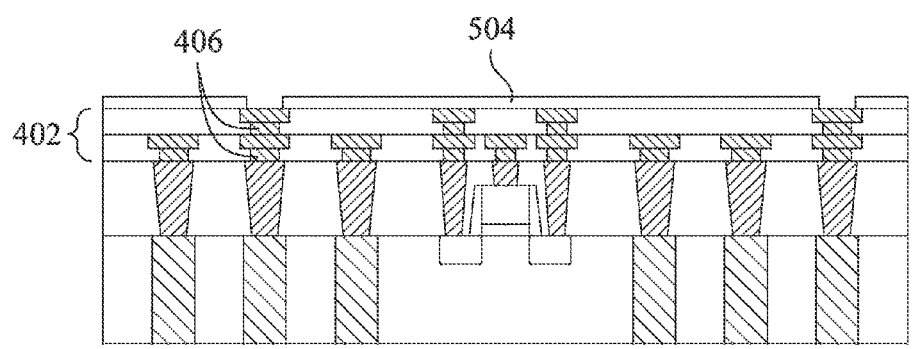

FIG. 4 is a cross-sectional view illustrating formation of an insulating layer 504 according to some embodiments. The insulating layer 504 is an oxide, nitride, oxynitride, carbide or the like, and is deposited, for example, by CVD, PECVD or another deposition process. The insulating layer 504 is patterned, for example, by depositing the insulating layer 504 in the openings of a patterned mask or by deposition, masking and etching. The insulating layer 504 has openings, according to some embodiments, that expose conductive elements 406 in the topmost metallization layer 402.

Figure 5:
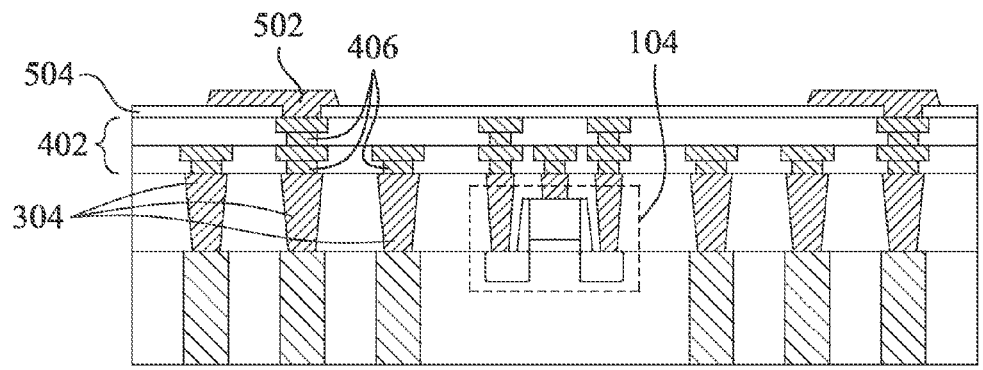

FIG. 5 is a cross-sectional view illustrating formation of top contact pads 502 on the insulating layer 504 according to some embodiments. The top contact pads 502 are formed, in come embodiments, from aluminum, copper, gold, aluminum-copper alloy, or the like, by deposition in a patterned mask or by deposition and etching. The top contact pads 502 extend through the openings in the insulating layer 504 to contact one of the conductive elements 406. The top contact pads 502 are electrically connected to the vias 202 or to the electrical devices 104 by way of the conductive elements 406 and contact plugs 304.

Figure 6:
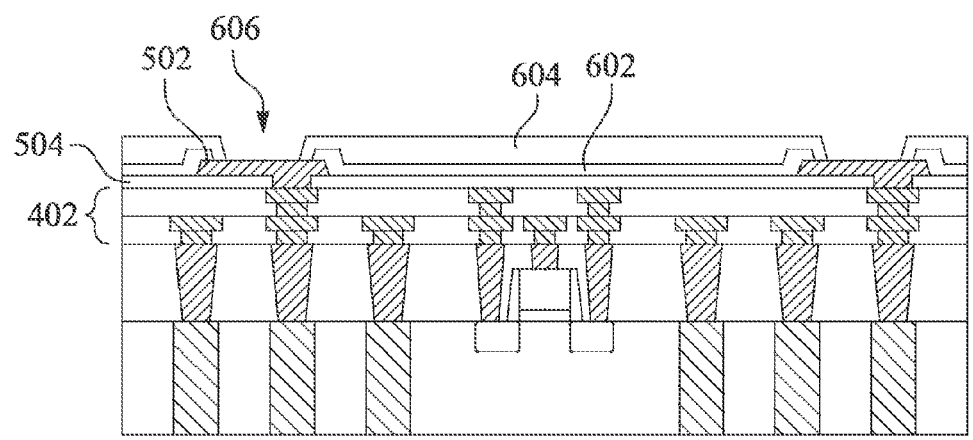

FIG. 6 is a cross-sectional view illustrating formation of a passivation layer 602 and protection layer 604 according to some embodiments. The passivation layer 602 is an oxide, nitride, carbide oxynitride or the like, such as, for example, silicon oxide, silicon nitride, silicon carbide or silicon oxynitride. The passivation layer 602 is formed by CVD, PECVD, a spin-on glass process, or another deposition process. The passivation layer 602 seals the underlying layers and provides protection against corrosion. The protection layer 604 is an electrically insulating material such as a polymer, polyimide or dielectric. The protection layer 604 is blanket formed or spin coated, and provides a barrier that protects the passivation layer 602 and underlying layers from physical damage. The passivation layer 602 and protection layer 604 are formed with openings 606 exposing the surface of the top contact pads 502, and in some embodiments are patterned by deposition, masking and etching, or by deposition over a patterned mask.

Figure 7:
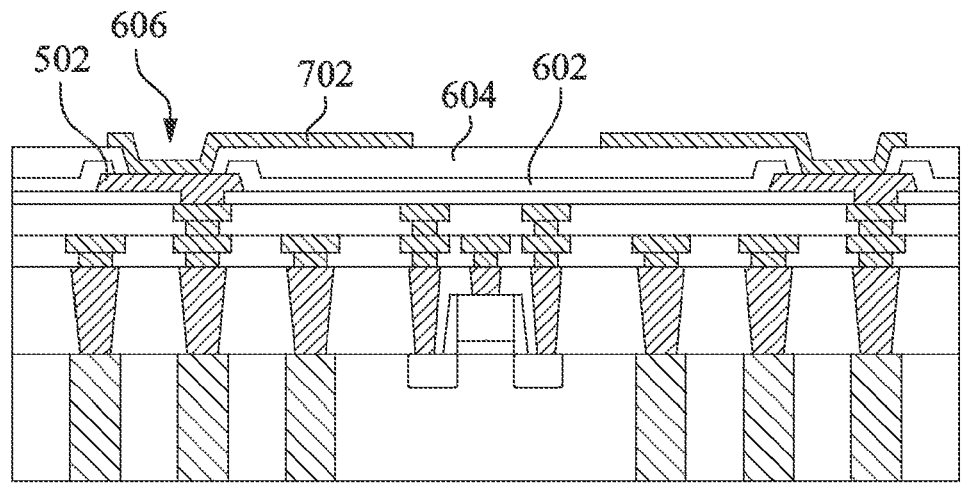

FIG. 7 is a cross-sectional view illustrating formation of post-passivation interconnects (PPIs) 702 according to some embodiments. The PPIs 702 are disposed on the protection layer 604 and extend through the openings 606 to contact the top contact pads 502. The PPIs 702 extend horizontally from the top contact pads 502. The PPIs 702 are formed or deposited using an epitaxy process, plating process, CVD, PECVD, or another process. In an embodiment, the PPIs 702 are copper, but, in other embodiments, may be polysilicon, gold (Au), aluminum, tantalum, tungsten (W), or another conductive material, alloy or compound. Copper PPIs 702 may, for example, be formed using photolithography and deposition processes such as PECVD, physical vapor deposition (PVD), or another deposition process.

Figure 8:
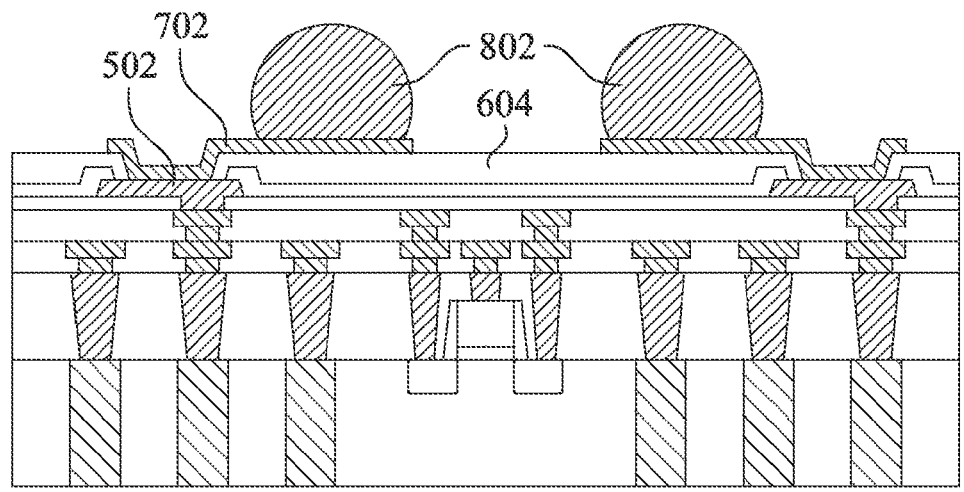

FIG. 8 is a cross-sectional view illustrating formation of connectors 802 on the PPIs 702 according to some embodiments. The connectors 802 are formed on the PPIs 702 to permit connection to outside devices, packages, boards, wafers, substrates or the like. The connectors 802 are formed from a conductive material such as solder, copper, solder paste, tin (Sb), a conductive polymer, an alloy, or another conductive material or combination of conductive materials. In some embodiments, the connectors 802 are solder balls in a ball grid array (BGA), but in other embodiments, the connectors 802 are conductive bumps, studs, pillars, wire loops, a combination of structures, or another conductive connector.

Figure 9:
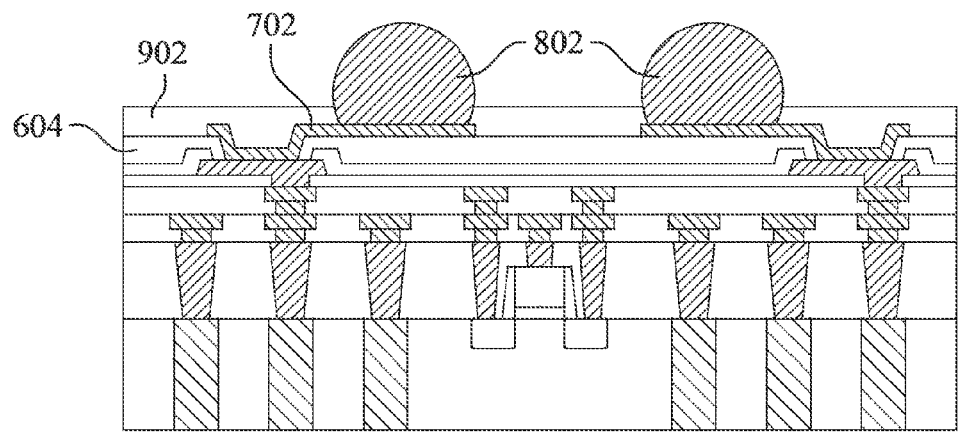

FIG. 9 is a cross-sectional view of forming molding compound 902 over the PPIs 702 according to an embodiment. The molding compound 902 is formed around the connectors 802 and on the PPIs 702 and protection layer 604. In some embodiments, the molding compound 902 is shaped or molded using for example, a mold (not shown) which may have a border or other feature for retaining molding compound 902 when applied. Such a mold may be used to pressure mold the molding compound 902 around the connectors 802 to force the molding compound 902 into openings and recesses, eliminating air pockets or the like in the molding compound 902. In other embodiments, the molding compound 902 is applied using spin coating or the like, and removed from the upper surfaces of the connectors 802 by, for example, a plasma clean, etch, solvent, or the like.

In an embodiment, the molding compound 902 is a nonconductive or dielectric material, such as an epoxy, a resin, a moldable polymer such as PBO, or another moldable material. For example, the molding compound 902 is an epoxy or resin that is cured through a chemical reaction or by drying. In another embodiment, the molding compound 902 is an ultraviolet (UV) cured polymer.

In some embodiments, the molding compound 902 is formed over the PPIs 702 with a thickness between about 20 µm and about 120 µm. It has been discovered that forming the molding compound 902 around the connectors 802 and directly on the PPIs 702 permits the use of a smaller pitch between connectors and increased reliability for the connectors 802 when mounting the package to external devices. The above described range of thicknesses for the molding compound 902 provides protection and insulation for the PPIs 702 while permitting adequate exposure of the connectors 802 for subsequent mounting of additional devices. Additionally, the molding compound 902 formed in the disclosed arrangement permits increased size and smaller pitch for solder ball grid arrays. For example, in some embodiments the overall size of the solder ball grid array is about 8 mm or larger.

Figure 10:
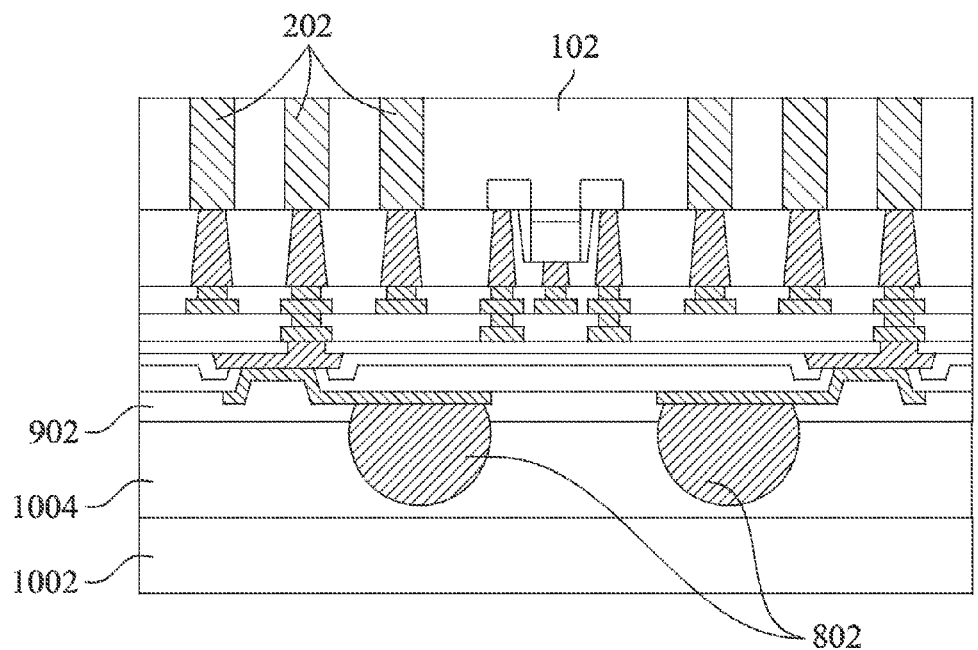

FIG. 10 is a cross-sectional view of mounting the substrate 102 to a carrier 1002 and thinning of the substrate 102 according to an embodiment. The package is inverted to permit access to, and processing of, the backside of the substrate 102. The molding compound 902 surface and connectors 802 are bonded to, for example, a carrier 1002 such as a glass substrate or other handling substrate. The package is attached to the carrier 1002 using die attachment film (DAF) 1004, an adhesive, or the like. In some embodiments, the backside of the substrate 102 is thinned or reduced by grinding, CMP, etching or another process after mounting to the carrier 1002. The vias 202 are exposed through the backside of the substrate 102 after reduction of the substrate 102. Thus, for embodiments where the openings for the vias are etched partway through the substrate 102 and the vias extend partially through the substrate 102, the grinding of the backside of the substrate 102 exposed the vias 202 by removing the substrate 102 covering the backside of the vias 202.

Figure 11:
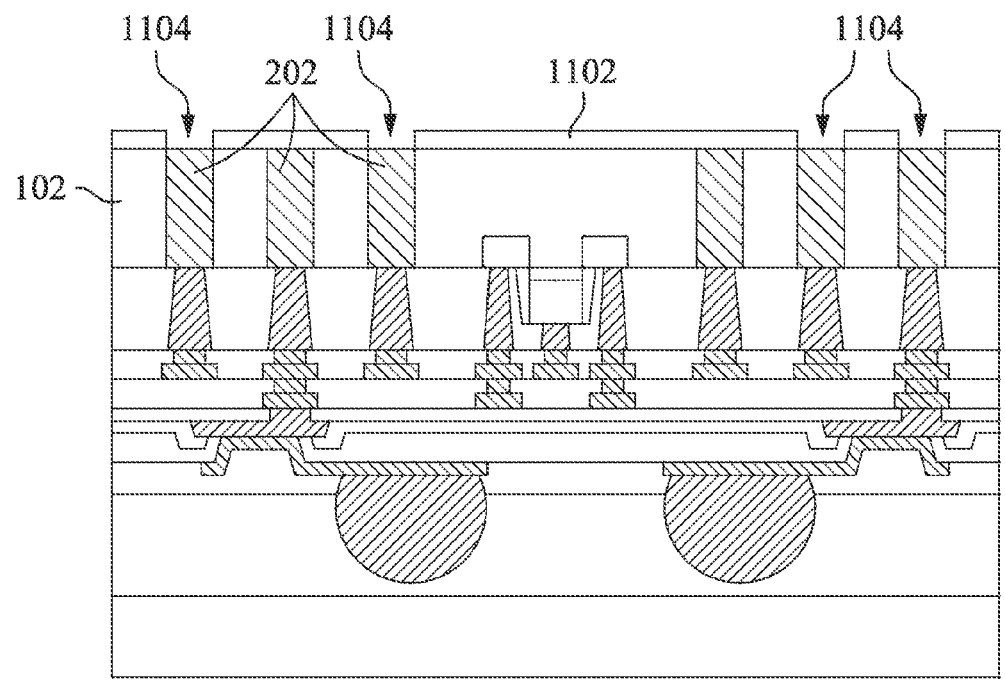

FIG. 11 is a cross-sectional view of forming a passivation layer 1102 over the backside of the substrate 102 according to some embodiments. In some embodiments, the passivation layer 1102 is formed from materials, and using a process, as described above with respect to passivation layer 602. The passivation layer 1102 has a substantially planar top surface and is patterned to have openings 1104 disposed over, and exposing, end surfaces of one or more of the vias 202.

Figure 12:
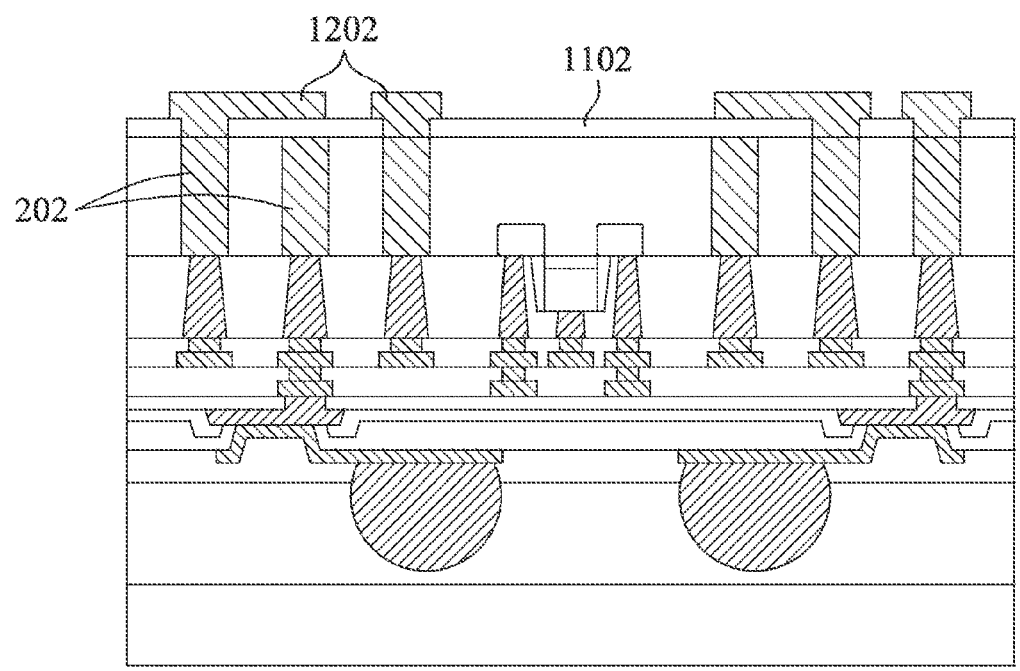

FIG. 12 is a cross-sectional view illustrating formation of conductive elements 1202 according to some embodiments. A bottom RDL is formed on the backside of the package by providing conductive elements 1202 over the passivation layer 1102. The conductive elements 1202, in some embodiments, are copper, gold, aluminum, tantalum, tungsten, or another conductive material, alloy or compound. The conductive elements 1202 are formed by, for example, CVD, PVD or PECVD deposition of a metal layer, followed by masking and etching of the metal layer to pattern the metal layer. The conductive elements 1202 contact the ends of the vias 202 and extend through the openings 1104 on the passivation layer 1102 over the passivation layer 1102. In some embodiments, the conductive elements 1202 extend laterally from the vias 202 that they contact.

Figure 13:
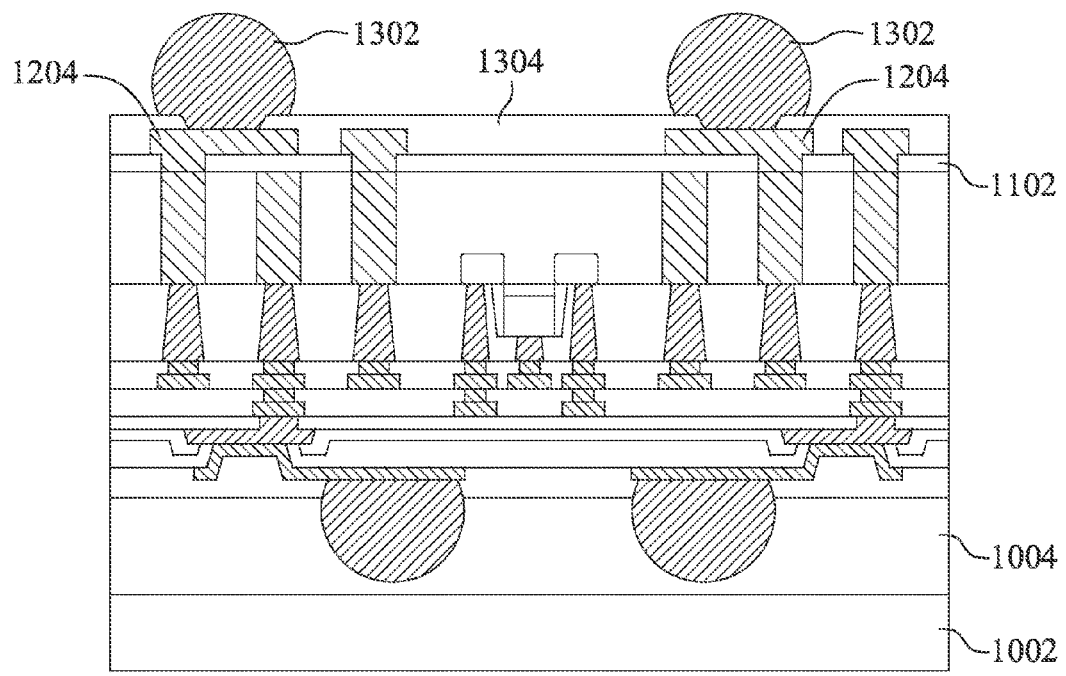

FIG. 13 is a cross-sectional view illustrating formation of protection layer 1403 and mounting of connectors 1302. In some embodiments, the connectors 1302 are solder balls in a ball grid arrays (BGA), but in other embodiments, the connectors 1302 are conductive bumps, studs, pillars, wire loops, a combination of structures, or another conductive connector. The protection layer 1304 is formed over the conductive elements 1202 and is an electrically insulating material such as a polymer, polyimide or dielectric. The protection layer 1304 is blanket formed or spin coated, and provides a barrier that electrically insulates the conductive elements 1202, and protects the passivation layer 1102, conductive elements 1202 and underlying layers from physical damage. In some embodiments, the protection layer 1304 is formed over the conductive elements 1202 with openings exposing the conductive elements 1202 for mounting of the connectors 1302. In other embodiments, the connectors 1302 are mounted to the conductive elements 1202, and the protection layer 1304 is a molding compound formed around the connectors 1302 as described above with respect to molding compound 902. In other embodiments, the protection layer 1304 is omitted.

Figure 14:
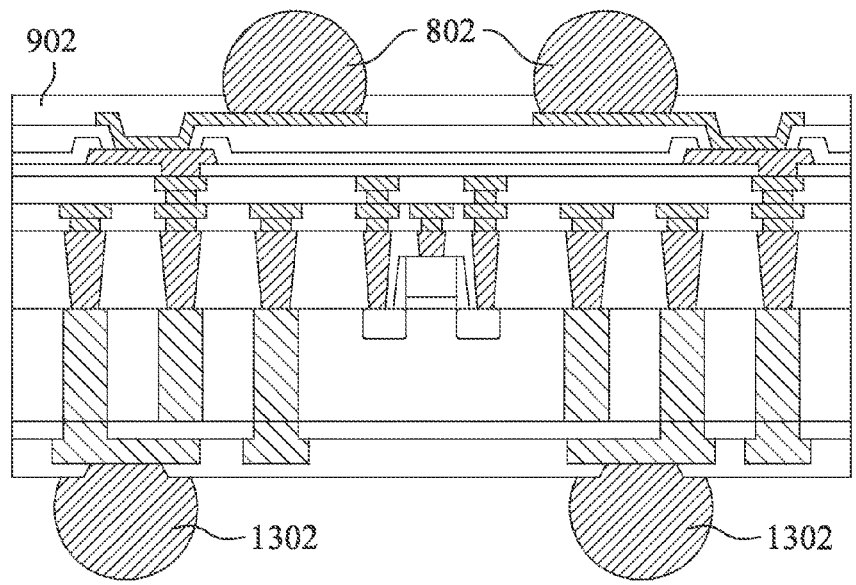

FIG. 14 is a cross-sectional view illustrating the package after removal of the carrier 1002 and die attachment film 1004 according to some embodiments. The package is prepared for mounting to a carrier, board, package, die, wafer or other device by removing the package from the carrier 1002 and removing the die attachment film 1004 from over the connectors 802. The package is, in some embodiments inverted prior to mounting so that the connectors 802 and molding compound 902 are disposed at the top side of the package.

While the preceding figures illustrate a method for forming the described package with connectors 1302 and a single layer of conductive elements 1204 on the backside of the package, the package is not limited to such arrangements. FIGS. 15 through 19 illustrate the package having arrangements of structures on the backside according to various embodiments.

Figure 15:
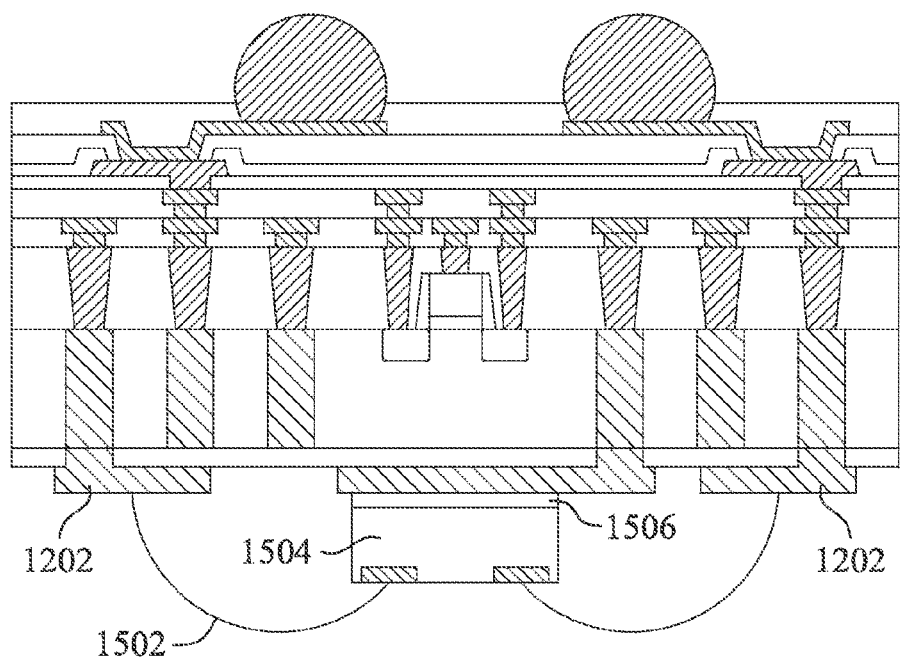
FIGS. 15-19 illustrate cross-sectional views of dies with connection structures according to some embodiments.
Figure 16:
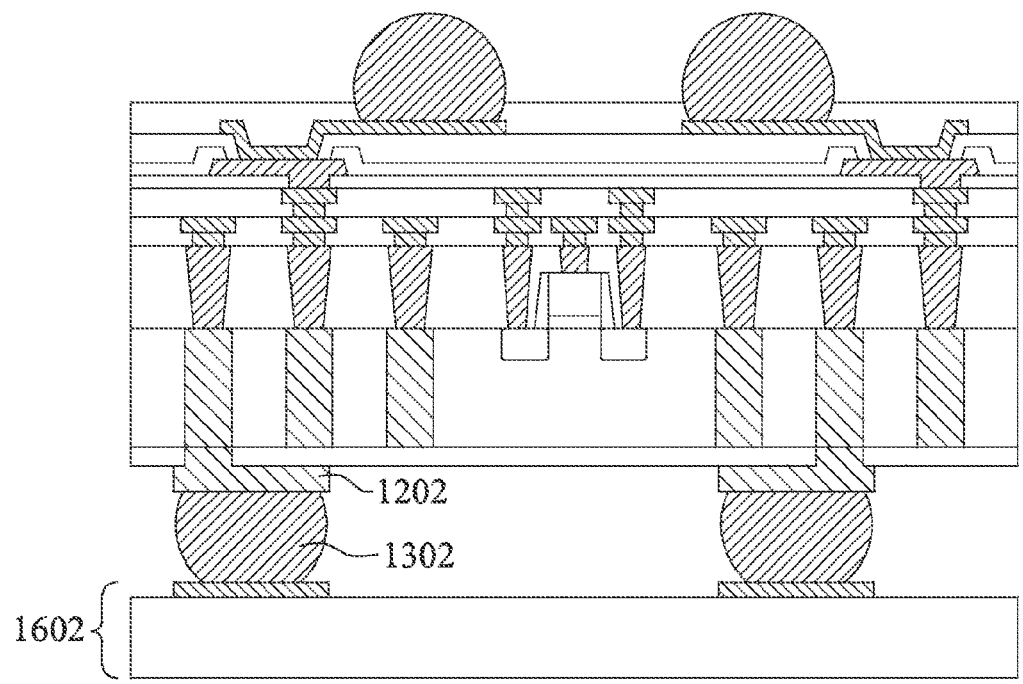

FIGS. 15 and 16 illustrate embodiments of a package having structures disposed on the backside of the package and connected directly to the conductive elements 1202. FIG. 15 is a cross-sectional view illustrating a package with a die 1504 disposed on the backside of the package according to some embodiments. The die 1504 is attached to the backside of the package by a die attachment film 1506, adhesive or the like, and is wirebonded to the conductive elements 1204 by one or more wires 1502. In such an embodiment, the conductive elements 1204 are exposed without a protective layer, however in other embodiments, a protective layer is disposed over the conductive elements 1204 and has openings permitting bonding of the wires 1502.

FIG. 16 is a cross-sectional view illustrating a package mounted on a second package 1602 according to some embodiments. The second package is a wafer, die, substrate, PCB or another structure. Connectors 1302, such as those described above with respect to FIG. 13, electrically connect the conductive elements 1204 to a second package 1302, for example, in a flip-chip chip scale package (fcCSP) arrangement, a wafer-level chip scale package (WLCSP) arrangement, or the like.

Figure 17:
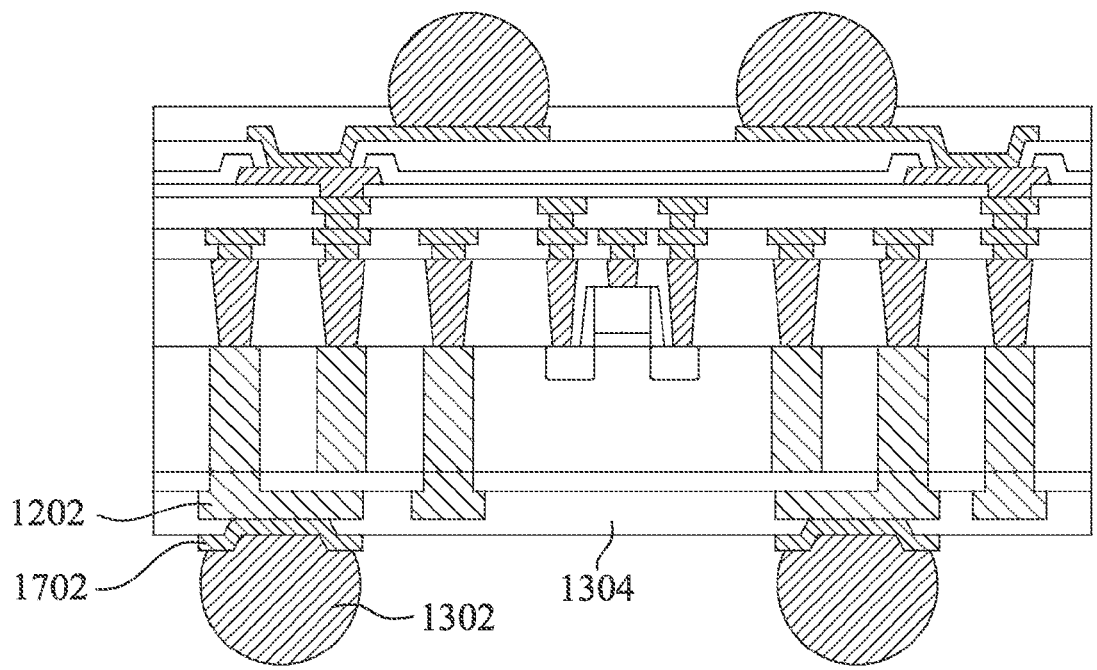
Figure 18:
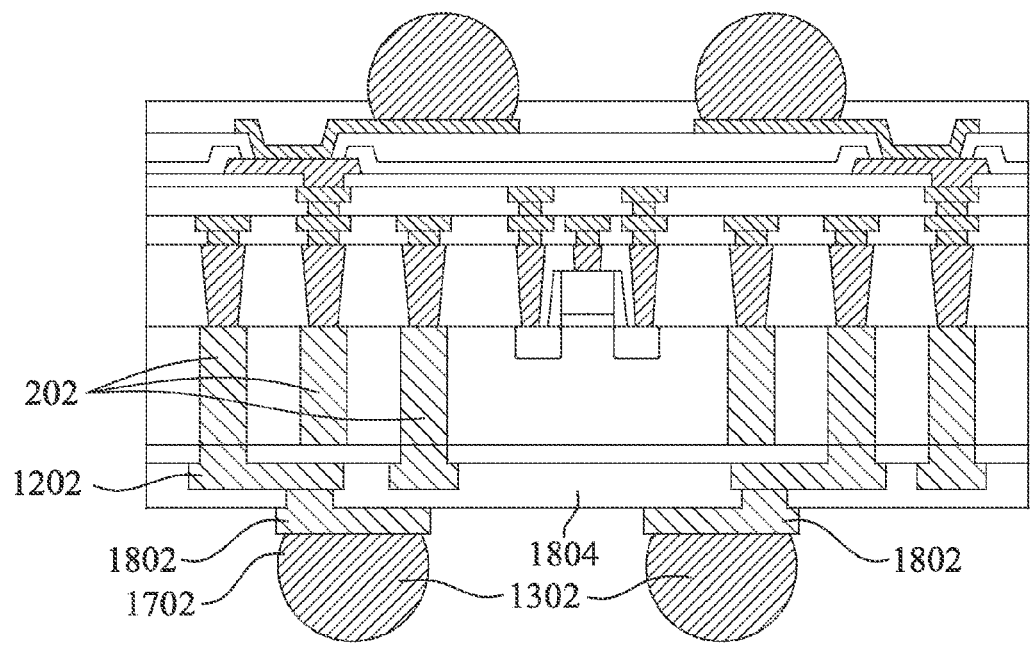
Figure 19:
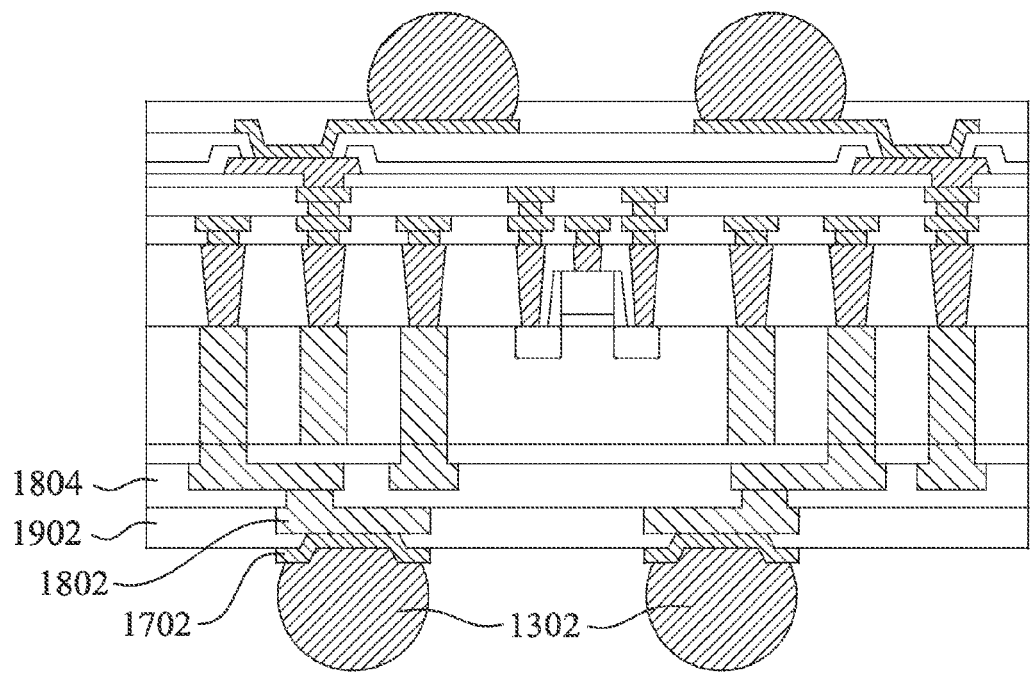

FIGS. 17 through 19 illustrate embodiments of a package with multiple layers of conductive structures on the backside of the package. FIG. 17 is a cross-sectional view illustrating a package having underbump metallization (UBM) 1702 structures formed on the back side of the package according to some embodiments. In such embodiments, the protection layer 1304 is formed over the conductive elements 1204 with openings exposing the conductive elements 1204. A metal layer is formed over the protection layer 1304 and extending through the protection layer to the conductive elements 1204. The metal layer is patterned to leave the UBMs 1702, and the connectors are formed on the UBMs 1702.

FIG. 18 is a cross-sectional view illustrating a package having multiple layers of conductive elements 1204 and 1802 disposed on the backside of the package according to some embodiments. In such embodiments, second conductive elements 1802 are formed on an insulating layer 1804 such as a polyimide, PBO, dielectric, oxide, nitride, or the like. The second conductive elements 1802 contact the conductive elements 1204 through openings in the insulating layer 1804. The connectors 1302 are disposed on the second conductive elements are in electrical contact with the vias 202 by way of the conductive elements 1202 and the second conductive elements 1802.

FIG. 19 is a cross-sectional view illustrating a package having UBMs 1702 disposed on multiple layers of conductive elements 1204 and 1802 according to some embodiments. In such embodiments, a second insulating layer 1902 is formed over the second conductive elements 1802, and UBMs 1702 are formed over the second insulating layer 1902, for example, as described above with respect to FIG. 17.

Figure 20:
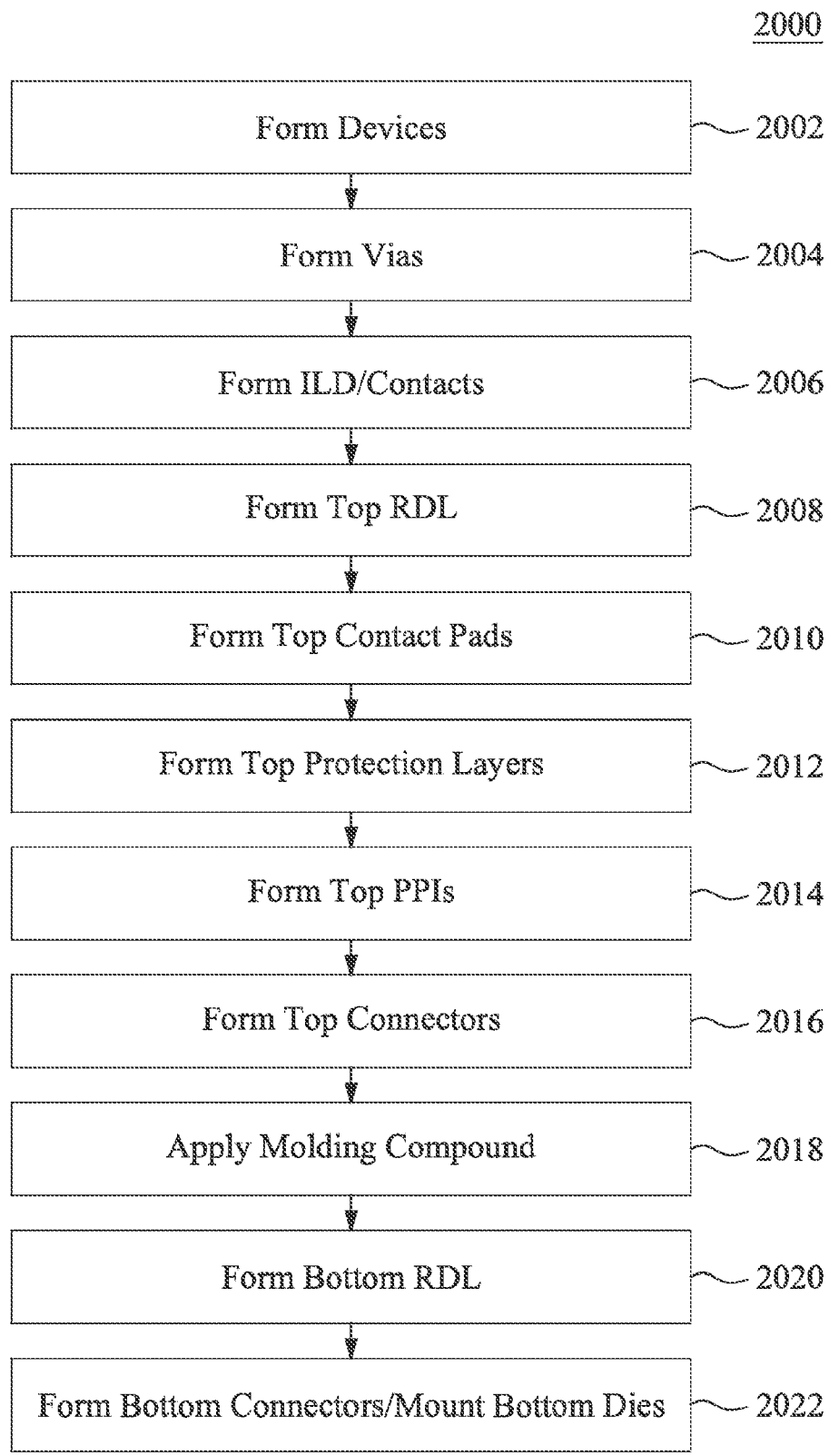
FIG. 20 is a flow diagram illustrating method steps for forming structures according to some embodiments.

FIG. 20 is a flow diagram illustrating a method 2000 of forming structures according to some embodiments. Electrical devices are formed on a substrate in block 2002, and vias are formed in the substrate in block 2004. The ILD is formed on the front side of the substrate in block 2006, and contacts or contact plugs are formed in the ILD. The top metallization layers are formed over the ILD in block 2008 and top contact pads are formed over the top metallization layers in block 2010. Protection layers are formed over the contact pads in block 2012 and top PPIs are formed over the top protection layers in block 2014. Top connectors are formed on the top PPIs in block 2016, and molding compound is applied over the top PPIs and around the top connectors in block 2018. A bottom RDL with conductive elements and/or UBMs is formed on the backside of the package in block 2020. In some embodiments, bottom connectors are formed on the conductive elements or UBMs and the package is mounted to a second package in block 2022.

Thus, according to some embodiments, a package comprises a substrate having electrical devices disposed at a first side of the substrate, vias extending from the first side of the substrate to a second side of the substrate opposite the first side and metallization layers disposed on the first side of the substrate. Contact pads are disposed over the first metallization layers and a protection layer is disposed over the contact pads. Post-passivation interconnects are disposed over the protection layer and extend to the contact pads through openings in the protection layer. Connectors are disposed on the PPIs and a molding compound extends over the PPIs and around the connectors.

According to another embodiment, a package comprises a substrate having vias disposed therein and extending from a circuit side to a back side of the substrate. An interlayer dielectric (ILD) is disposed on the circuit side of the substrate, with the ILD having contact plugs that extend through the ILD and that are in electrical contact with the vias. Metallization layers are disposed over the ILD, the metallization layers having first conductive elements disposed in one or more intermetal dielectric layers, wherein the first conductive elements are in electrical contact with the contact plugs. An insulating layer is disposed on the metallization layers, with the insulating layer having openings exposing the first conductive elements. Contact pads are disposed over the insulating layer and in electrical contact with the first conductive elements. Interconnects are disposed over the contact pads, each of the interconnects in electrical contact with a respective one of the contact pads and extending laterally from the respective one of the contact pads. Connectors are disposed on the interconnects and a molding compound is disposed around the connectors and covering portions of the interconnects. The connectors extend past a surface of the molding compound.

A method according to an embodiment comprises providing a substrate having electrical devices on a circuit side of the substrate, the substrate having vias extending through the substrate. Metallization layers are formed over the circuit side of the substrate, with the metallization layers having conductive features disposed therein and electrically connected to the electrical devices and to the vias. Contact pads are formed on the metallization layers and interconnects are formed on the contact pads, the interconnects extending laterally from the contact pads. Connectors are formed on the interconnects and a molding compound layer is formed over portions of the interconnects and around lower portions of the connectors.

In accordance with some embodiments disclosed herein, there is a provided a device comprising a first integrated die including a transistor formed at a top surface of the die and a conductive through via extending from the top surface to a back surface of the die. The device further includes a metallization layer on the top surface of the die, contact pads disposed over the first metallization layer, and a protection layer disposed over the contact pads. The device further includes a first redistribution layer (RDL) disposed over the protection layer and extending to the contact pads through openings in the protection layer, first connectors disposed on the first RDL, and a molding compound over the first RDL and around the first connectors. A second RDL is disposed on the bottom surface of the die and electrically connected to the conductive through via; and a second integrated circuit die is mounted to the bottom surface of the die and electrically connected to the second RDL.

In accordance with other embodiments described herein there is provided a package comprising a substrate having a conductive through via disposed therein, the conductive through via extending from a circuit side to a back side of the substrate, and an interlayer dielectric (ILD) disposed on the circuit side of the substrate, the ILD having a contact plug that extends through the ILD and is in electrical contact with the conductive through via. The package further includes a top metallization layer over the ILD, the top metallization layer having a first conductive element disposed in an intermetal dielectric layer, the first conductive element being in electrical contact with the contact plug, and an insulating layer disposed on the metallization layer, the insulating layer having an opening exposing the first conductive element. A contact pad is disposed over the insulating layer and in electrical contact with the first conductive element, and a first redistribution layer (RDL) is disposed over the contact pad and extending laterally from the contact pad. A second RDL layer is disposed over the backside of the substrate and in electrical contact with the conductive through via, and a device is electrically mounted to the second RDL.

In accordance with yet other embodiments disclosed herein, there is provided for a method comprising forming a hole from a top surface of a back surface of a substrate, lining the hole with a liner, and filling the lined hole with a conductor to form a through substrate via. The method further includes forming at least one transistor at the top surface of the substrate, depositing an inter level dielectric layer on the top surface and forming a contact plug therein, the contact plug being electrically connected to the through substrate via, depositing an inter metal dielectric layer over the inter level dielectric layer, patterning the inter metal dielectric layer with trenches and filling the trenches with conductive material. The method yet further includes covering the filled trenches with a patterned insulating layer, the patterned insulating layer having openings therein exposing the filled trenches, and connecting contact pads to the filled trenches by way of the openings. A redistribution layer (RDL) is formed over the patterned insulating layer, the RDL extending laterally over a major surface of the insulating layer and electrically contacting the contact pads, respective connectors are adhered to respective contact pads, and encapsulating peripheral portions of the connectors and portions of the RDL are encapsulated in a molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first integrated circuit die including a transistor formed at a top surface of the first integrated circuit die and a conductive through via extending from the top surface to a bottom surface of the first integrated circuit die;
   a metallization layer over the top surface of the first integrated circuit die;
   contact pads disposed over the metallization layer;
   a protection layer disposed over the contact pads;

a first redistribution layer (RDL) disposed over the protection layer and extending to the contact pads through openings in the protection layer;

first connectors disposed over/on the first RDL;

a molding compound over the first RDL and around the first connectors;

a second RDL disposed on the bottom surface of the first integrated circuit die and electrically connected to the conductive through via; and a second integrated circuit die mounted to the bottom surface of the first integrated circuit die and electrically connected to the second RDL.

2. The device of claim 1, wherein the second integrated circuit die is wire bonded to the second RDL.

3. The device of claim 1, further including a passivation layer between the protection layer and the contact pads.

4. The device of claim 1, wherein the conductive through via comprises an opening extending through the first integrated circuit die, a liner lining the opening, and a conductor filling the lined opening.

5. The device of claim 1, wherein the first connectors are disposed directly on the first RDL.

6. The device of claim 1, further comprising second connectors electrically connected to the second RDL.

7. The device of claim 1, wherein the first RDL includes conductive elements that extend laterally from the contact pads; and
wherein the first connectors are laterally spaced apart from the contact pads.

8. The device of claim 1, wherein the second integrated circuit die is connected to the second RDL by way of solder balls.

9. The device of claim 1, further comprising a second conductive through via and wherein the second RDL electrically connects the conductive through via and the second conductive through via.

10. The device of claim 1, further comprising a contact plug electrically connecting the conductive through via to the metallization layer.

11. A package, comprising:
a substrate having a conductive through via disposed therein, the conductive through via extending from a circuit side to a back side of the substrate;
an interlayer dielectric (ILD) disposed on the circuit side of the substrate, the ILD having a contact plug that extends through the ILD and is in electrical contact with the conductive through via;
a top metallization layer over the ILD, the top metallization layer having a first conductive element disposed in an intermetal dielectric layer, the first conductive element being in electrical contact with the contact plug;
an insulating layer disposed on the top metallization layer, the insulating layer having an opening exposing the first conductive element;
a contact pad disposed over the insulating layer and in electrical contact with the first conductive element;
a first redistribution layer (RDL) disposed over the contact pad and extending laterally from the contact pad;
a second RDL disposed over the back side of the substrate and in electrical contact with the conductive through via; and
a device electrically mounted to the second RDL.

12. The package of claim 11, wherein the device is an integrated circuit that is wire bonded to the second RDL.

13. The package of claim 11, wherein the device is a component selected from the group consisting of a wafer, a die, a substrate, and a printed circuit board (PCB).

14. The package of claim 11, further comprising a molding compound disposed around a connector and covering a portion of the first RDL, wherein the connector extends past a surface of the molding compound.

15. The package of claim 11, wherein the device is an integrated circuit die that is electrically mounted to the second RDL by way of solder balls.

16. The package of claim 11, wherein the contact pad is disposed directly on the insulating layer, and wherein the contact pad has a portion extending through an opening in the insulating layer and contacting the first conductive element in the top metallization layer.

17. The package of claim 11, further comprising a protection layer disposed on the insulating layer and extending over the contact pad, wherein the first RDL is are disposed directly on the protection layer.

18. A method, comprising:
forming a hole from a top surface to a back surface of a substrate;
lining the hole with a liner;
filling the lined hole with a conductor to form a through substrate via;
forming at least one transistor at the top surface of the substrate;
depositing an inter level dielectric layer on the top surface and forming a contact plug therein, the contact plug being electrically connected to the through substrate via;
depositing an inter metal dielectric layer over the inter level dielectric layer, patterning the inter metal dielectric layer with trenches and filling the trenches with conductive material;
covering the filled trenches with a patterned insulating layer, the patterned insulating layer having openings therein exposing the filled trenches;
connecting contact pads to the filled trenches by way of the openings;
forming a redistribution layer (RDL) over the patterned insulating layer, the RDL extending laterally over a major surface of the patterned insulating layer and electrically contacting the contact pads;
adhering respective connectors to respective contact pads; and
encapsulating peripheral portions of the connectors and portions of the RDL in a molding compound.

19. The method of claim 18, further comprising forming a protection layer on the patterned insulating layer, wherein the RDL is formed directly on the protection layer and extends through openings in the protection layer to contact the contact pads.

20. The method of claim 18, further comprising forming a second RDL over the back surface of the substrate.

* * * * *

UNITED STATES PATENT AND TRADEMARK OFFICE
CERTIFICATE OF CORRECTION

PATENT NO. : 9,530,759 B2  
APPLICATION NO. : 15/090475  
DATED : December 27, 2016  
INVENTOR(S) : Chen-Hua Yu Page 1 of 1

It is certified that error appears in the above-identified patent and that said Letters Patent is hereby corrected as shown below:

In the Claims

In Column 12, Line 21, Claim 17, delete "is are disposed" and insert --is disposed--.

Signed and Sealed this  
Eighteenth Day of April, 2017

Michelle K. Lee  
*Director of the United States Patent and Trademark Office*